US011187927B2

(12) United States Patent
Yabuki

(10) Patent No.: US 11,187,927 B2
(45) Date of Patent: Nov. 30, 2021

(54) DISPLAY DEVICE

(71) Applicant: Panasonic Liquid Crystal Display Co., Ltd., Himeji (JP)

(72) Inventor: Hiroyuki Yabuki, Hyogo (JP)

(73) Assignee: PANASONIC LIQUID CRYSTAL DISPLAY CO., LTD., Hyogo (JP)

( * ) Notice: Subject to any disclaimer, the term of this patent is extended or adjusted under 35 U.S.C. 154(b) by 100 days.

(21) Appl. No.: 16/688,004

(22) Filed: Nov. 19, 2019

(65) Prior Publication Data

US 2020/0166786 A1    May 28, 2020

(30) Foreign Application Priority Data

Nov. 27, 2018  (JP) .............................. JP2018-220971

(51) Int. Cl.

| | |
|---|---|
| *G02F 1/13* | (2006.01) |
| *G02F 1/1362* | (2006.01) |
| *G02F 1/1345* | (2006.01) |
| *G02F 1/1343* | (2006.01) |
| *G02F 1/1333* | (2006.01) |
| *G01R 31/28* | (2006.01) |

(52) U.S. Cl.
CPC ...... *G02F 1/1309* (2013.01); *G02F 1/136259* (2013.01); *G01R 31/2825* (2013.01); *G02F 1/13452* (2013.01); *G02F 1/133308* (2013.01); *G02F 1/134309* (2013.01); *G02F 1/136254* (2021.01); *G02F 2201/123* (2013.01); *G02F 2201/40* (2013.01)

(58) Field of Classification Search
CPC ............. G02F 1/1309; G02F 1/136254; G02F 1/136259
See application file for complete search history.

(56) References Cited

U.S. PATENT DOCUMENTS

| | | | |
|---|---|---|---|
| 2002/0075248 A1* | 6/2002 | Morita | G09G 3/3677 345/204 |
| 2015/0015820 A1 | 1/2015 | Masutani et al. | |
| 2016/0247436 A1* | 8/2016 | Lee | G09G 3/2003 |

FOREIGN PATENT DOCUMENTS

JP          2015-018144          1/2015

* cited by examiner

*Primary Examiner* — Dung T Nguyen
(74) *Attorney, Agent, or Firm* — Hamre, Schumann, Mueller & Larson, P.C.

(57) ABSTRACT

A display device according to a present disclosure comprises: a display region; a frame region disposed around the display region; a plurality of first wirings extending in a first direction in the display region; a first drive circuit electrically connected to one end of each of the plurality of first wirings; a first inspection wiring electrically connected to another end of each of the plurality of first wirings through each of a plurality of inspection thin film transistors; a second inspection wiring connected to a gate electrode of each of the plurality of inspection thin film transistors; an inspection drive circuit electrically connected to the second inspection wiring; and an inspection circuit electrically connected to the first inspection wiring, wherein at least a part of the second inspection wiring extends in the first direction in the display region.

11 Claims, 7 Drawing Sheets

DISPLAY DEVICE

CROSS-REFERENCE TO RELATED APPLICATION

This application claims priority from Japanese application JP 2018-220971, filed Nov. 27, 2018. This Japanese application is incorporated herein by reference.

BACKGROUND

1. Technical Field

The present invention relates to a display device.

2. Description of the Related Art

A display device described in Unexamined Japanese Patent Publication No. 2015-018144 includes a plurality of inspection transistors connected to inspect disconnection of a gate line and a data line. In a disconnection inspection process, the inspection transistor is turned on, and an amount of current passed through the inspection transistor and an amount of charge are measured, whereby the disconnection of the gate line and the data line can be inspected.

SUMMARY

However, in the conventional display device, there is a problem that an area of a frame region disposed around a display region of the display device is enlarged. That is, in the conventional configuration, the area of the frame region is enlarged according to the area where wiring is disposed to turn on the inspection transistor.

The present disclosure has been made in view of the above circumstances, and an object of the present disclosure is to reduce the area of the frame region in the display device having the function of inspecting wiring extending in the display region.

To solve the above problem, a display device according to a present disclosure comprises: a display region; a frame region disposed around the display region; a plurality of first wirings extending in a first direction in the display region; a first drive circuit electrically connected to one end of each of the plurality of first wirings; a first inspection wiring electrically connected to another end of each of the plurality of first wirings through each of a plurality of inspection thin film transistors; a second inspection wiring connected to a gate electrode of each of the plurality of inspection thin film transistors; an inspection drive circuit electrically connected to the second inspection wiring; and an inspection circuit electrically connected to the first inspection wiring, wherein at least a part of the second inspection wiring extends in the first direction in the display region.

The liquid crystal display device according to the present disclosure can improve the aperture ratio in the lateral electric field system liquid crystal display device.

Hereinafter, an exemplary embodiment of the present disclosure will be described with reference to the drawings. In the exemplary embodiment, a liquid crystal display device is described as an example of display device. However the present disclosure is not limited to the liquid crystal display device. For example the present disclosure may be an organic electroluminescence display (OLED) device.

Figure 1:
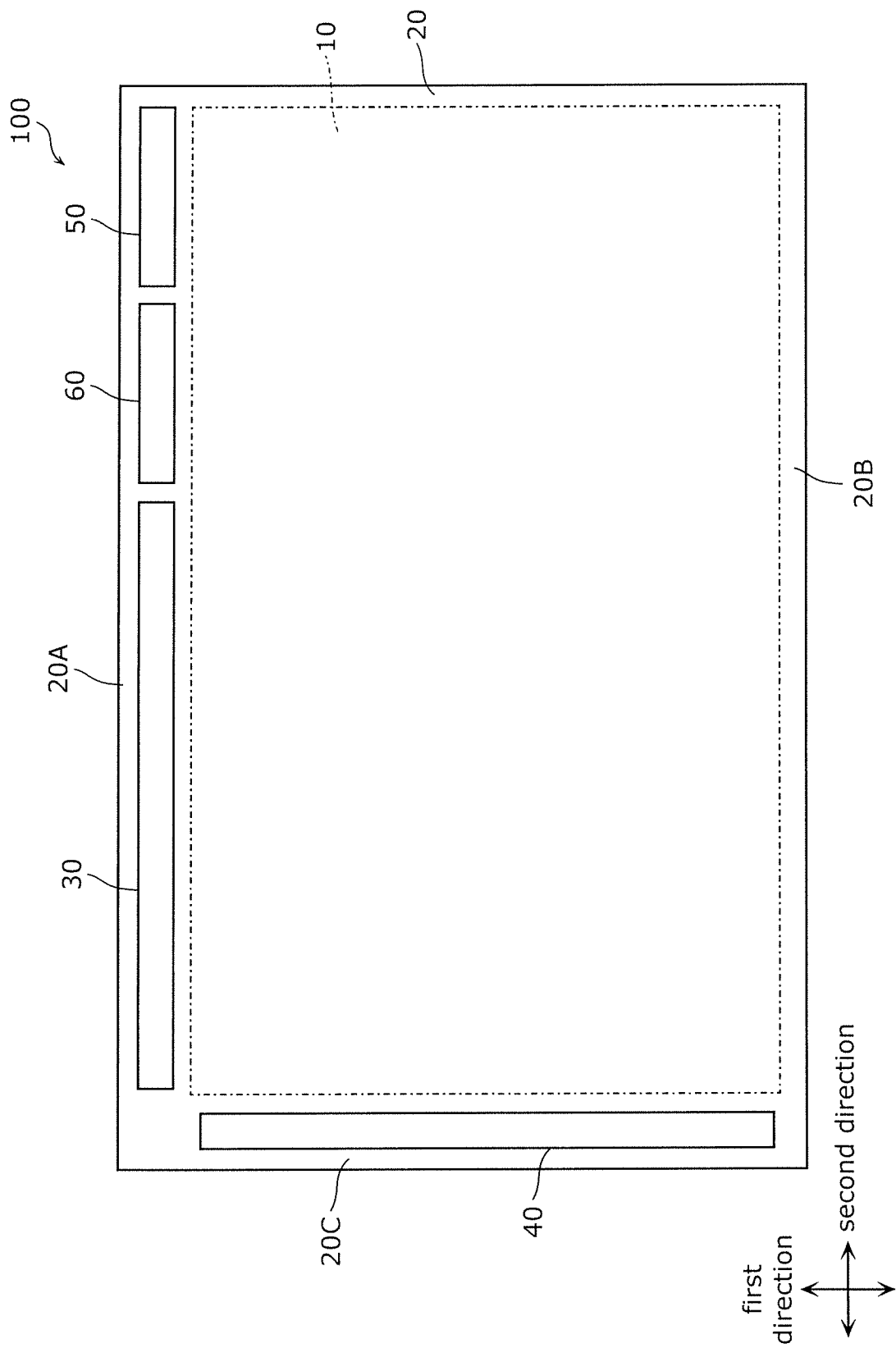
FIG. 1 is a plan view illustrating a schematic configuration of display device according to an exemplary embodiment.

FIG. 1 is a plan view illustrating a schematic configuration of display device 100 according to an exemplary embodiment. As illustrated in FIG. 1, display device 100 of the present exemplary embodiment includes display region 10 that displays an image and frame region 20 disposed around display region 10. First drive circuit 30, inspection circuit 50, and inspection drive circuit 60 are disposed in frame region 20. For example, first drive circuit 30 is a source line drive circuit or a gate line drive circuit. An example in which first drive circuit 30 is the source line drive circuit will be described in the present exemplary embodiment.

Figure 2:
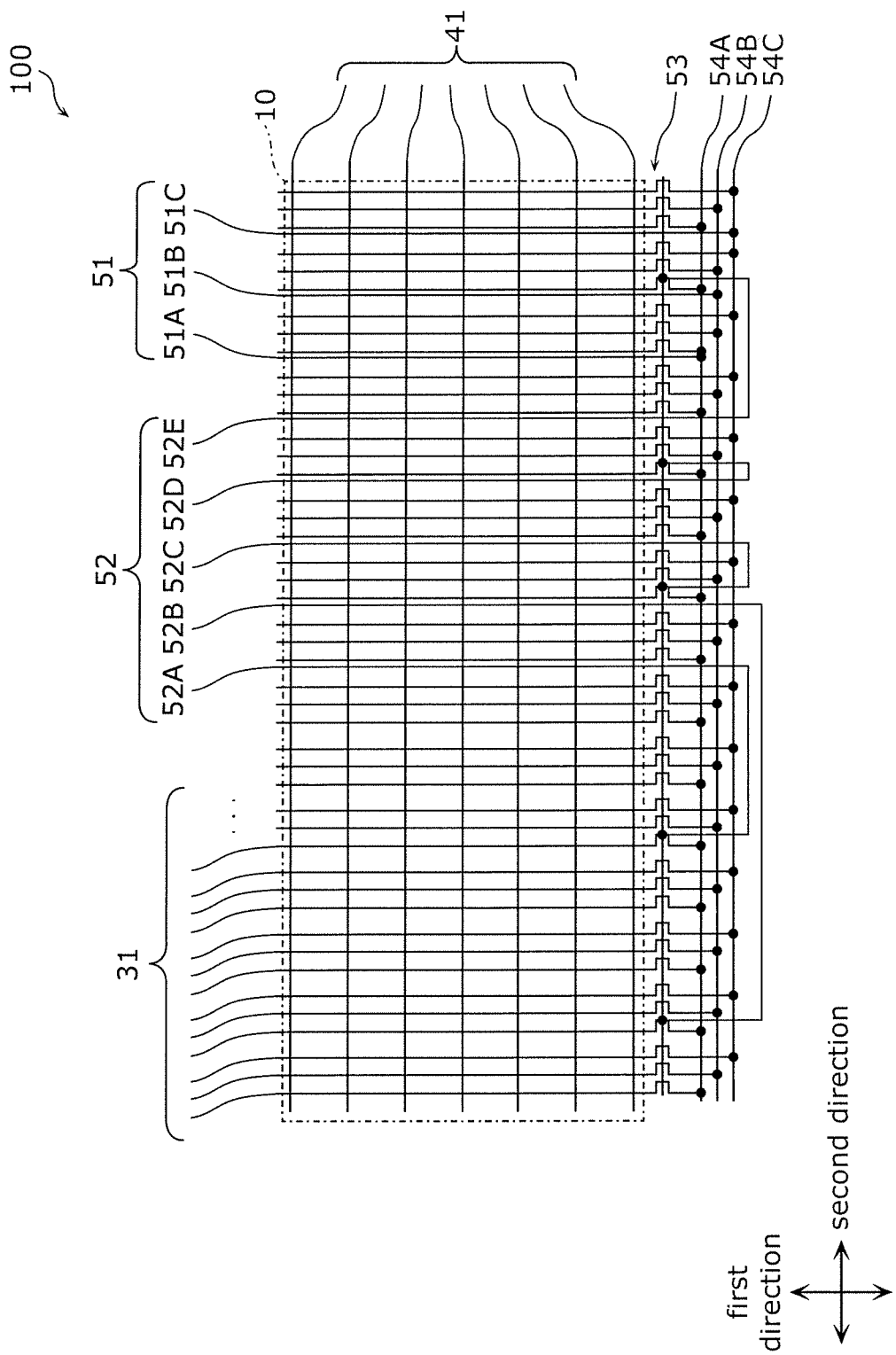
FIG. 2 is a schematic diagram illustrating a disposition relationship of various wirings in display device according to the exemplary embodiment.

FIG. 2 is a schematic diagram illustrating a disposition relationship of various wirings in display device 100 of the present exemplary embodiment. As illustrated in FIG. 2, display device 100 includes a plurality of first wirings 31 extending in a first direction in display region 10. For example, first wiring 31 is a source line or a gate line. An example in which first wiring 31 is the source line will be described in the present exemplary embodiment. One end of each of the plurality of first wirings 31 is electrically connected to first drive circuit 30 in FIG. 1.

As illustrated in FIG. 2, an inspection thin film transistor 53 is disposed at the other end of each of the plurality of first wirings 31, and the plurality of first wirings 31 are connected to first inspection wiring 51 through inspection thin film transistors 53. The other end of first inspection wiring 51 is electrically connected to inspection circuit 50 in FIG. 1.

As illustrated in FIG. 2, second inspection wiring 52 is connected to a gate electrode of each of the plurality of inspection thin film transistors 53. One end of the second inspection wiring 52 is connected to inspection drive circuit 60 in FIG. 1, and at least a part of second inspection wiring 52 extends in the first direction in display region 10.

With this configuration, the area of frame region 20 in FIG. 1 can be reduced in display device 100 having a function of inspecting the wiring extending in display region 10. That is, in display device 100 of the present disclosure, at least a part of second inspection wiring 52 through which a signal for turning on inspection thin film transistor 53 is transmitted is disposed in display region 10, so that a space in which second inspection wiring 52 is disposed can be reduced in frame region 20, and therefore the area of frame region 20 can be reduced.

A more specific configuration of display device 100 of the present exemplary embodiment will be described below with reference to the drawings.

As illustrated in FIG. 1, in display device 100 of the present exemplary embodiment, second drive circuit 40 is disposed in frame region 20, in addition to first drive circuit 30 and inspection circuit 50. In the example of FIG. 1, inspection circuit 50 and inspection drive circuit 60 are disposed in first edge side region 20A of frame region 20. In frame region 20, second drive circuit 40 is disposed in edge side region 20C intersecting with first edge side region 20A where first drive circuit 30 is disposed. For example, second drive circuit 40 is a gate line drive circuit or a source line drive circuit. An example in which second drive circuit 40 is the gate line drive circuit will be described in the present exemplary embodiment.

As illustrated in FIG. 2, in display region 10, display device 100 includes a plurality of second wirings 41 extending in a second direction intersecting with the first direction. For example, second wirings 41 is a gate line or a source line, and an example in which second wiring 41 is the gate line will be described in the present exemplary embodiment. The plurality of second wirings 41 are electrically connected to second drive circuit 40 in FIG. 1.

Figure 3:
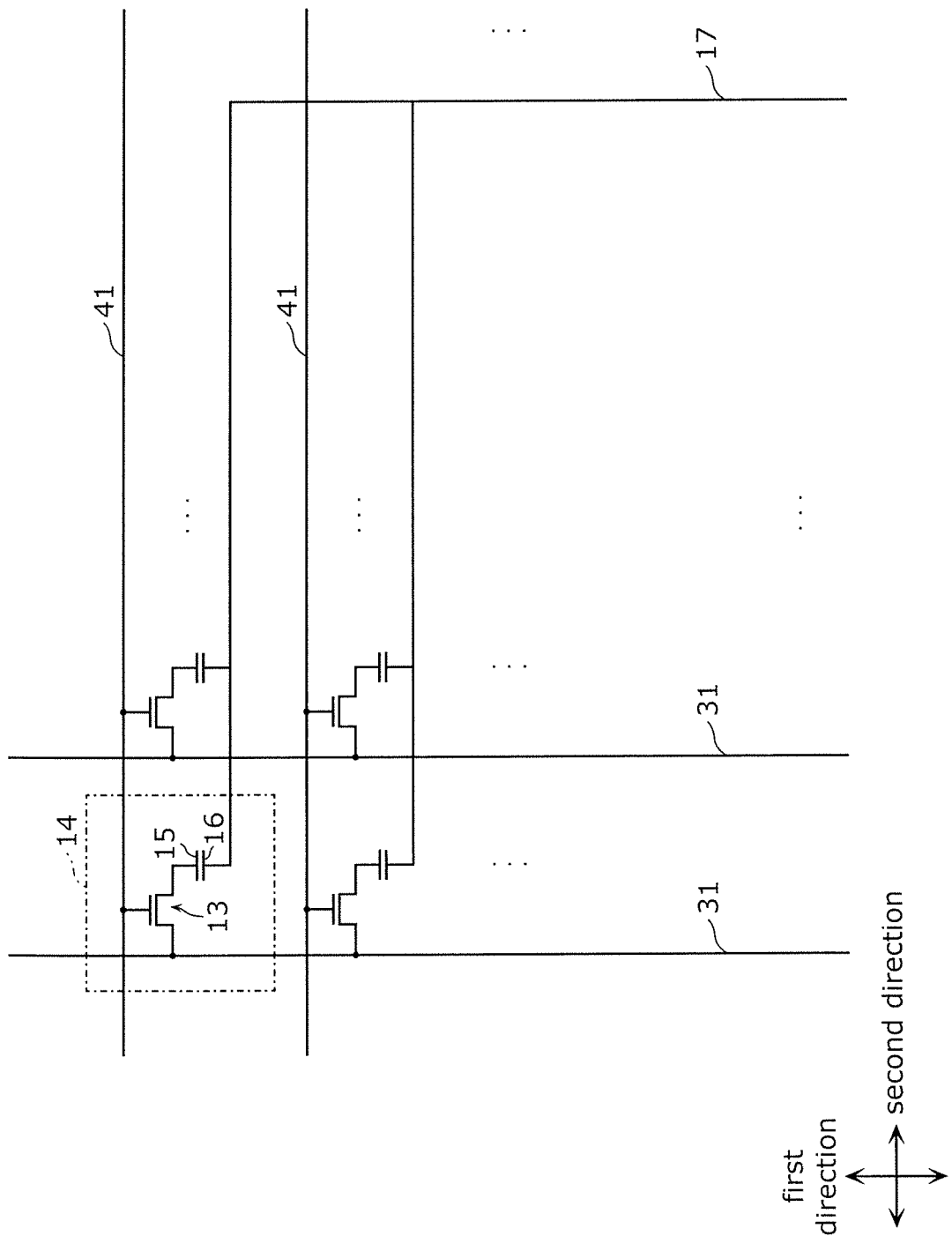
FIG. 3 is an equivalent circuit diagram illustrating a schematic configuration of display device according to the exemplary embodiment.

FIG. 3 is an equivalent circuit diagram illustrating a schematic configuration of display device 100 of the present exemplary embodiment. As described above with reference to FIG. 2, display device 100 includes source lines as the plurality of first wirings 31 extending in the first direction and gate lines as the plurality of second wirings 41 extending in the second direction. Thin film transistor 13 is provided at an intersection of each source line and each gate line.

In display device 100, a plurality of pixels 14 are arranged in the first direction and the second direction according to the intersections of the source lines and the gate lines. Although not illustrated, display device 100 includes a thin film transistor substrate, a color filter substrate, and a liquid crystal layer sandwiched between the two substrates. In the thin film transistor substrate, a plurality of pixel electrodes 15 are provided according to pixels 14. Common electrode 16 common to pixels 14 is provided in the color filter substrate. Common electrode 16 may be provided in the thin film transistor substrate.

A source signal is supplied from first drive circuit 30 in FIG. 1 to each source line (first wiring 31). A gate-on voltage is supplied from second drive circuit 40 in FIG. 1 to each gate line (second wiring 41). A common voltage is supplied from a common electrode drive circuit (not illustrated) to common electrode 16 through common line 17. When the gate-on voltage is supplied to the gate line, thin film transistor 13 connected to the gate line is turned on, and a source voltage that is the source signal is supplied to pixel electrode 15 through the source line connected to thin film transistor 13. An electric field is generated by a difference between the source voltage supplied to pixel electrode 15 and the common voltage supplied to common electrode 16. In display device 100, a liquid crystal is driven by the electric field to control transmittance of light emitted from a backlight, thereby displaying the image. In performing color display, a desired source voltage is supplied to the source line connected to pixel electrode 15 of pixel 14 corresponding to each of red, green, and blue colors that are formed by a stripe-shaped color filter.

An example of an inspection method of the present exemplary embodiment will be described below.

The inspection gate-on voltage is output from inspection drive circuit 60 in FIG. 1, and supplied to the gate electrode of inspection thin film transistor 53 disposed in second edge side region 20B (see FIG. 1) through second inspection wiring 52 in FIG. 2, and inspection thin film transistor 53 to which the inspection gate-on voltage is supplied is turned on. In the present exemplary embodiment, because one of the plurality of second inspection wirings 52 is connected to at least two inspection thin film transistors 53 as illustrated in FIG. 2, at least two inspection thin film transistors 53 are turned on when the inspection gate-on voltage is supplied to one second inspection wiring 52. For example, when the inspection gate-on voltage is supplied to second inspection wiring 52B disposed second from the left in FIG. 2, nine inspection thin film transistors 53 disposed first to ninth from the left in FIG. 2 are turned on.

When the nine inspection thin film transistors 53 disposed first to ninth from the left in FIG. 2 are turned on, for example, first wirings 31 disposed first, fourth, and seventh from the left and wiring 54A extending in the second direction are electrically connected through three inspection thin film transistors 53. As illustrated in FIG. 2, because wiring 54A extending in the second direction and first inspection wiring 51A are electrically connected to each other, the signal is transmitted from first wirings 31 disposed first, fourth, and seventh from the left to first inspection wiring 51A. Presence or absence of a defect such as a short circuit can be inspected in first wirings 31 disposed first, fourth, and seventh from the left by measuring a voltage value or a current value using inspection circuit 50 connected to first inspection wiring 51A. As described above, in the present exemplary embodiment, one of the plurality of first inspection wirings 51 is electrically connected to at least two inspection thin film transistors 53, and at least two first wirings 31 connected to the at least two inspection thin film transistors 53 can be inspected using one first inspection wiring 51. With this configuration, a number of first inspection wirings 51 can be decreased, and the plurality of first inspection wirings 51 can be arranged in a limited space of display region 10.

Similarly, the presence or absence of the defect can be inspected in first wirings 31 disposed second, fifth, and eighth from the left by measuring the voltage value and the current value of first inspection wiring 51B electrically connected through three inspection thin film transistors 53 and wiring 54B using the inspection circuit 50. The presence or absence of the defect can be inspected in first wirings 31 disposed third, sixth, and ninth from the left by measuring the voltage value and the current value of first inspection wiring 51C electrically connected through three inspection thin film transistors 53 and wiring 54C using the inspection circuit 50.

Subsequently, when the inspection gate-on voltage is supplied to second inspection wiring 52A disposed first from the left in FIG. 2, nine inspection thin film transistors 53 disposed tenth to eighteenth from the left in FIG. 2 are turned on, and the presence or absence of the defect can be inspected in nine first wirings 31 connected to nine inspection thin film transistors 53.

As described above, the plurality of inspection thin film transistors 53 in each of which the gate electrode is connected to second inspection wiring 52 are turn on by supplying the inspection gate-on voltage from the plurality of second inspection wirings 52 corresponding to each area. The presence or absence of the defect can be inspected in the plurality of first wirings 31 connected to the plurality of turned-on inspection thin film transistors 53 by measuring the current value and the voltage value that are transmitted through first inspection wiring 51.

Figure 4:
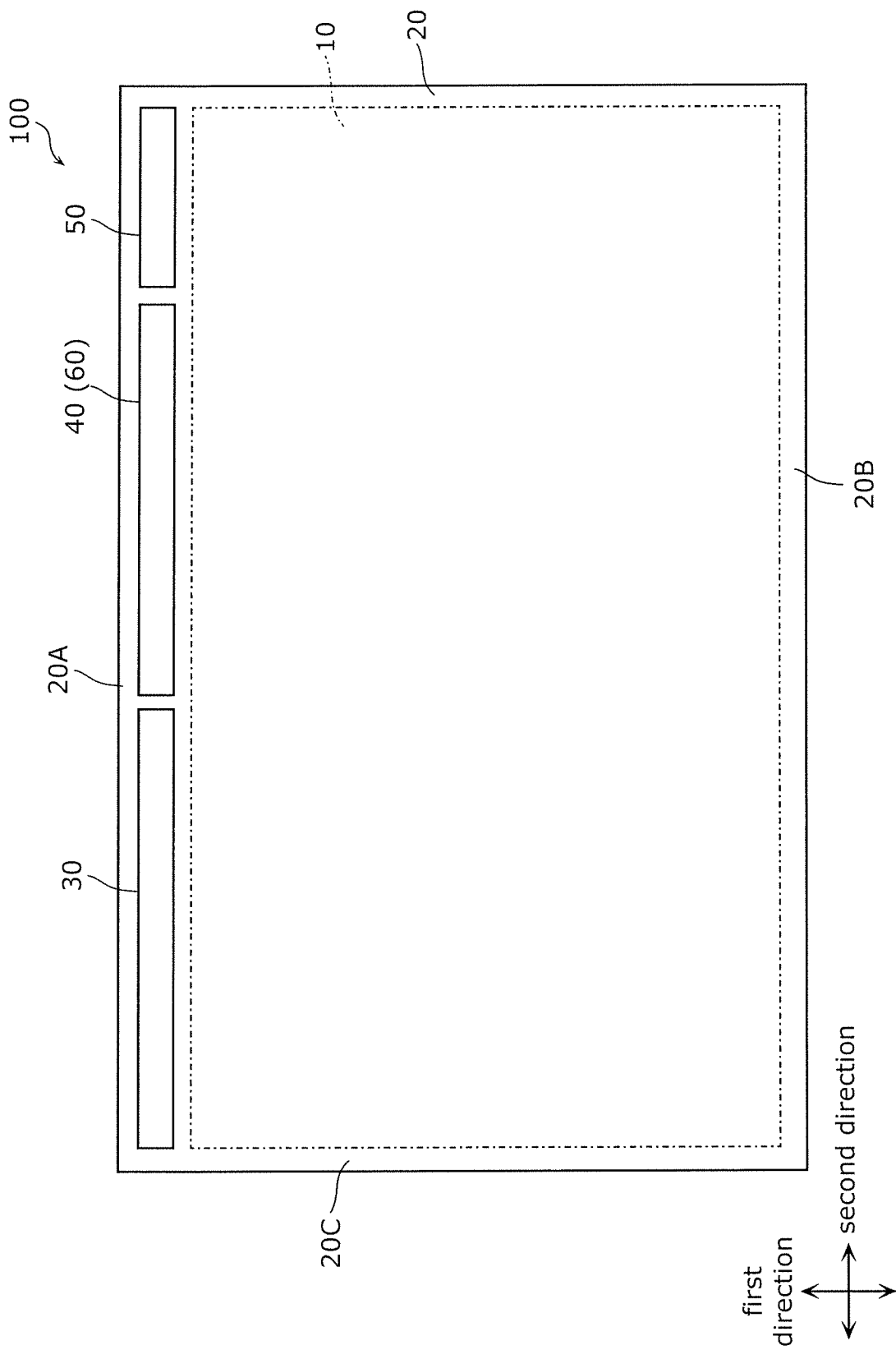
FIG. 4 is a plan view illustrating a schematic configuration of display device according to another example of the exemplary embodiment.
Figure 5:
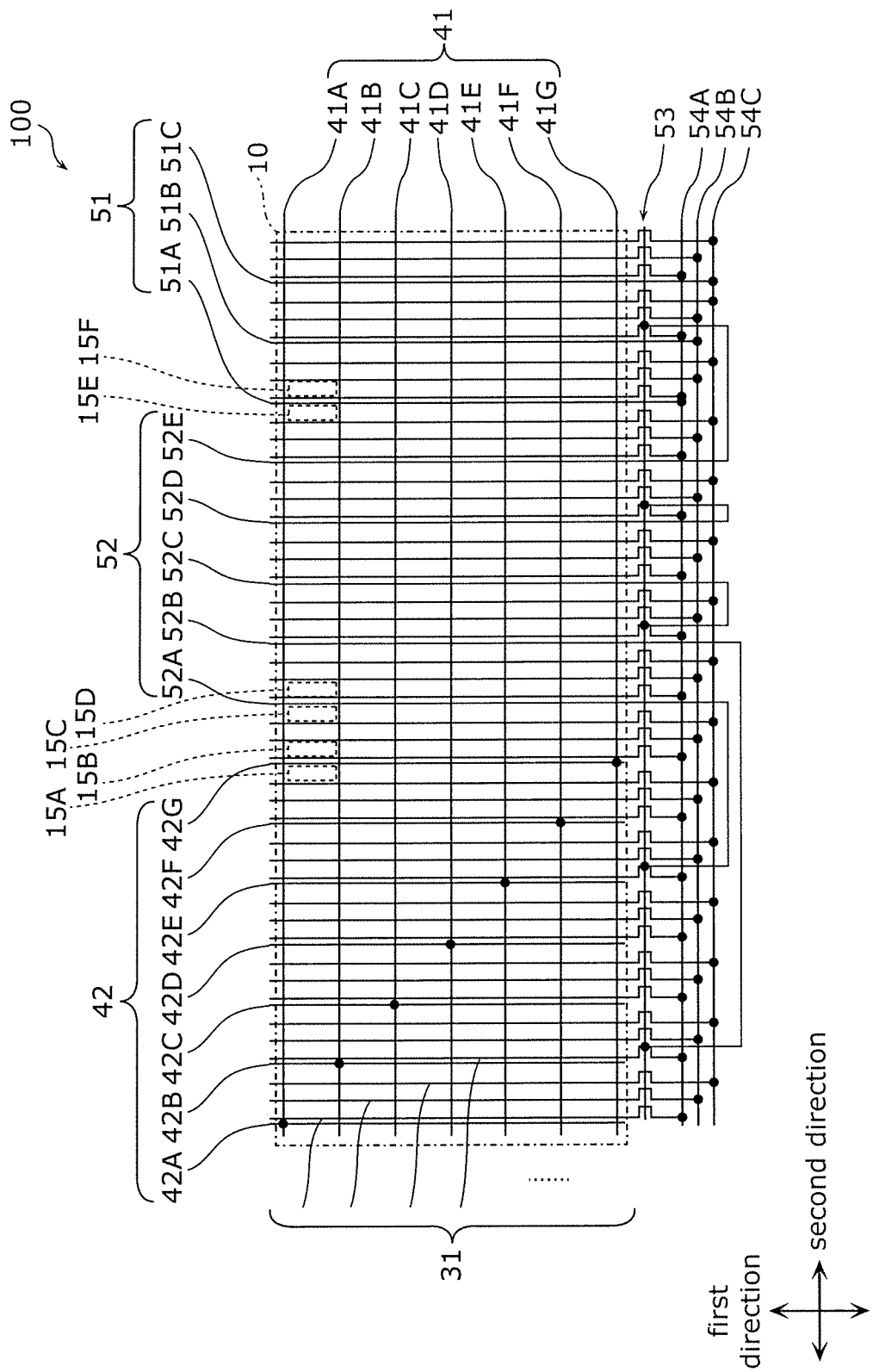
FIG. 5 is a schematic diagram illustrating a disposition relationship of various wirings in display device according to the exemplary embodiment.

In the example of FIG. 1, in frame region 20, second drive circuit 40 is disposed in edge side region 20C intersecting with first edge side region 20A where first drive circuit 30 is disposed. Alternatively, as illustrated in FIG. 4, second drive circuit 40 may be disposed in first edge side region 20A where first drive circuit 30 is disposed, or disposed in second edge side region 20B that constitutes frame region 20 and is opposed to first edge side region 20A. In the examples of FIGS. 4 and 5, second drive circuit 40 is disposed in the first edge side region 20A where first drive circuit 30 is disposed.

In the present exemplary embodiment, as illustrated in FIG. 5, display device 100 includes a plurality of lead-out lines 42 extending in the first direction in display region 10. The plurality of lead-out lines 42 electrically connect each of the plurality of second wirings 41 and second drive circuit 40. When the gate-on voltage is supplied from second drive circuit 40 to the plurality of lead-out lines 42, the gate-on voltage is supplied to second wiring 41 connected to lead-out line 42, and thin film transistor 13 described above with reference to FIG. 3 is turned on.

In the present exemplary embodiment of FIGS. 4 and 5, inspection drive circuit 60 and second drive circuit 40 described above with reference to FIGS. 1 and 2 are disposed in identical first edge side region 20A, so that inspection drive circuit 60 can be included in second drive circuit 40.

An example of a series of operations relating to the image display in display region 10 and the inspection of first wiring 31 in the present exemplary embodiment in FIGS. 4 and 5 will be described below.

Second drive circuit 40 including inspection drive circuit 60 supplies the gate-on voltage to lead-out line 42A. When the gate-on voltage is supplied to lead-out line 42A, the gate-on voltage is supplied to second wiring 41A through lead-out line 42A. With the supply of the gate-on voltage, thin film transistor 13 (see FIG. 3) connected to second wiring 41A is turned on, and the source voltage that is the source signal is supplied to pixel electrode 15 through the source line connected to thin film transistor 13. An electric field is generated by a difference between the source voltage supplied to pixel electrode 15 and the common voltage supplied to common electrode 16. The liquid crystal is driven by the electric field to control the transmittance of the light emitted from the backlight, thereby displaying the image.

Subsequently, second drive circuit 40 supplies the gate-on voltage to lead-out line 42B. The supply of the gate-on voltage turns on thin film transistor 13 electrically connected to lead-out line 42B, and the source voltage that is the source signal is supplied to pixel electrode 15 through the source line connected to thin film transistor 13.

Second drive circuit 40 sequentially repeats this operation from the supply of the gate-on voltage to the lead-out line 42A to the supply of the gate-on voltage to lead-out line 42G, whereby the image can be displayed in display region 10.

After displaying one image in display region 10, second drive circuit 40 including inspection drive circuit 60 inspects first wiring 31 during a blank time until the display of the next image.

Specifically, after supplying the gate-on voltage to lead-out lines 42A to 42G, second drive circuit 40 supplies the inspection gate-on voltage to second inspection wirings 52A to 52E. For example, when the inspection gate-on voltage is supplied to second inspection wiring 52B disposed second from the left in FIG. 5, the nine inspection thin film transistors 53 disposed first to ninth from the left in FIG. 5 are turned on.

The flow of the subsequent inspection is as described above with reference to FIG. 2.

In the configuration of FIGS. 4 and 5, second drive circuit 40 can include inspection drive circuit 60, first wiring 31 can be inspected during the blank time until the display of the next image after the display of one image in display region 10.

Desirably the plurality of second inspection wirings 52 are disposed between the pixel electrodes in which the plurality of lead-out lines 42 are not disposed. As a specific example, as illustrated in FIG. 5, when lead-out line 42G is disposed between first pixel electrode 15A and second pixel electrode 15B that are adjacent to each other in the second direction, desirably second inspection wiring 52 is not disposed between first pixel electrode 15A and second pixel electrode 15B. When second inspection wiring 52A is disposed between third pixel electrode 15C and fourth pixel electrode 15D that are adjacent to each other, desirably lead-out line 42 is not disposed between third pixel electrode 15C and fourth pixel electrode 15D. Desirably the disposition of second inspection wiring 52 and lead-out line 42 is decided according to the configuration of a subpixel included in one pixel. For example, when three subpixels are arranged in the second direction in one pixel like RGB, desirably one second inspection wiring 52 or one lead-out line 42 is disposed for three first wirings 31. For example, when four subpixels are arranged in the second direction in one pixel like RGBW, desirably one second inspection wiring 52 or one lead-out line 42 is disposed for two or four first wirings 31.

With this configuration, ununiformity of an aperture ratio among the plurality of pixels included in display device 100 can be prevented. That is, ununiformity of the total number of second inspection wirings 52 and lead-out lines 42 that traverse one pixel is prevented by adopting this configuration, so that the ununiformity of the aperture ratio among the plurality of pixels included in display device 100 can be prevented.

As illustrated in FIG. 5, at least a part of the plurality of first inspection wirings 51 extends in the first direction in display region 10, so that the space in which the inspection wiring 51 is disposed can be reduced in frame region 20. Resultantly, the area of frame region 20 can further be reduced.

As described above, in the configuration in which at least a part of the plurality of first inspection wirings 51 is disposed in display region 10, desirably the plurality of first inspection wirings 51 is disposed between the pixel electrodes in which the plurality of second inspection wirings 52 and the plurality of lead-out lines 42 are not disposed. As a specific example, as illustrated in FIG. 5, when first inspection wiring 51A is disposed between fifth pixel electrode 15E and sixth pixel electrode 15F that are adjacent to each other in the second direction, desirably second inspection wiring 52 and lead-out line 42 are not disposed between fifth pixel electrode 15E and sixth pixel electrode 15F. Desirably first inspection wiring 51 is not disposed between first pixel electrode 15A and second pixel electrode 15B in which lead-out line 42G is disposed. Similarly, desirably first inspection wiring 51 is not disposed between third pixel electrode 15C and fourth pixel electrode 15D in which second inspection wiring 52A is disposed. Desirably the disposition of first inspection wiring 51, second inspection wiring 52, and lead-out line 42 is decided according to the configuration of the subpixel included in one pixel. For example, when the three subpixels are arranged in the second direction in one pixel like RGB, desirably one of one first inspection wiring 51, one second inspection wiring 52, and one lead-out line 42 is disposed for three first wirings 31. For example, when the four subpixels are arranged in the second direction in one pixel like RGBW, desirably one of one first inspection wiring 51, one second inspection wiring 52, and one lead-out line 42 is disposed for two or four first wirings 31.

With this configuration, ununiformity of an aperture ratio among the plurality of pixels included in display device 100 can be prevented. That is, the ununiformity of the total number of first inspection wiring 51, second inspection wirings 52, and lead-out lines 42 that traverse one pixel is prevented by adopting this configuration, so that the ununiformity of the aperture ratio among the plurality of pixels included in display device 100 can be prevented.

In the example of FIG. 5, the plurality of second inspection wirings 52 and the plurality of lead-out lines 42 are disposed in different regions, namely, the plurality of lead-out lines 42 are disposed in the left region in FIG. 5, and the plurality of second inspection wirings 52 are disposed in the right region from the center. However, the present disclosure is not limited to the example of FIG. 5.

Figure 6:
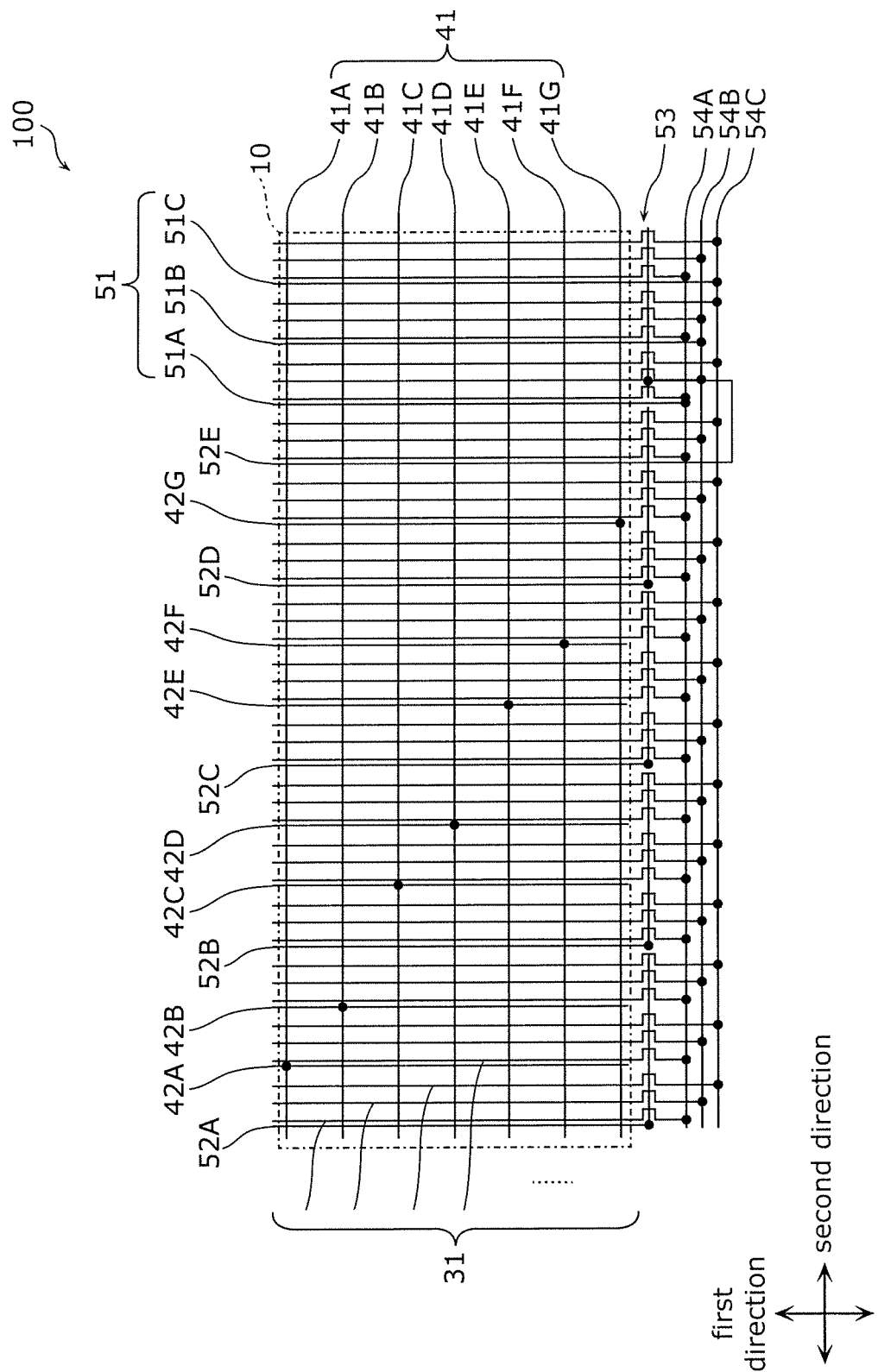
FIG. 6 is a schematic diagram illustrating a disposition relationship of various wirings in display device according to the exemplary embodiment.

For example, in a configuration of FIG. 6, at least one of the plurality of second inspection wirings 52 extends between two lead-out lines 42 adjacent to each other among the plurality of lead-out lines 42 in planar view. As a specific example, second inspection wiring 52B extends between lead-out lines 42B, 42C adjacent to each other, and second inspection wiring 52C extends between lead-out lines 42D, 42E adjacent to each other. Similarly, second inspection wiring 52D extends between lead-out lines 42F, 42G adjacent to each other.

With this configuration, the plurality of second inspection wirings 52 are dispersed and disposed in the second direction, so that routing of second inspection wiring 52 can be simplified in second edge side region 20B in FIG. 4. That is, each of the plurality of second inspection wirings 52 is disposed at a position close to the area to which each of the plurality of second inspection wirings 52 corresponds, so that the routing of second inspection wirings 52 can be simplified in second edge side region 20B.

In the configuration example of FIG. 6, second drive circuit 40 including inspection drive circuit 60 may inspect first wiring 31 during the blank time, or inspect the plurality of first wirings 31 while one image is displayed in display region 10. As a specific example, second drive circuit 40 sequentially supplies the gate-on voltage or the inspection gate-on voltage in the order of second inspection wiring 52A, lead-out lines 42A, 42B, second inspection wiring 52B, lead-out lines 42C, 42D, . . . , and second inspection wiring 52E from the left in the second direction of FIG. 6, and the plurality of first wirings 31 may be inspected while one image is displayed in display region 10.

In the examples of FIGS. 2, 5, and 6, the plurality of first inspection wirings 51 are collectively disposed in the region on the right side in FIGS. 2, 5, and 6. However, the present disclosure is not limited to the examples of FIGS. 2, 5, and 6.

Figure 7:
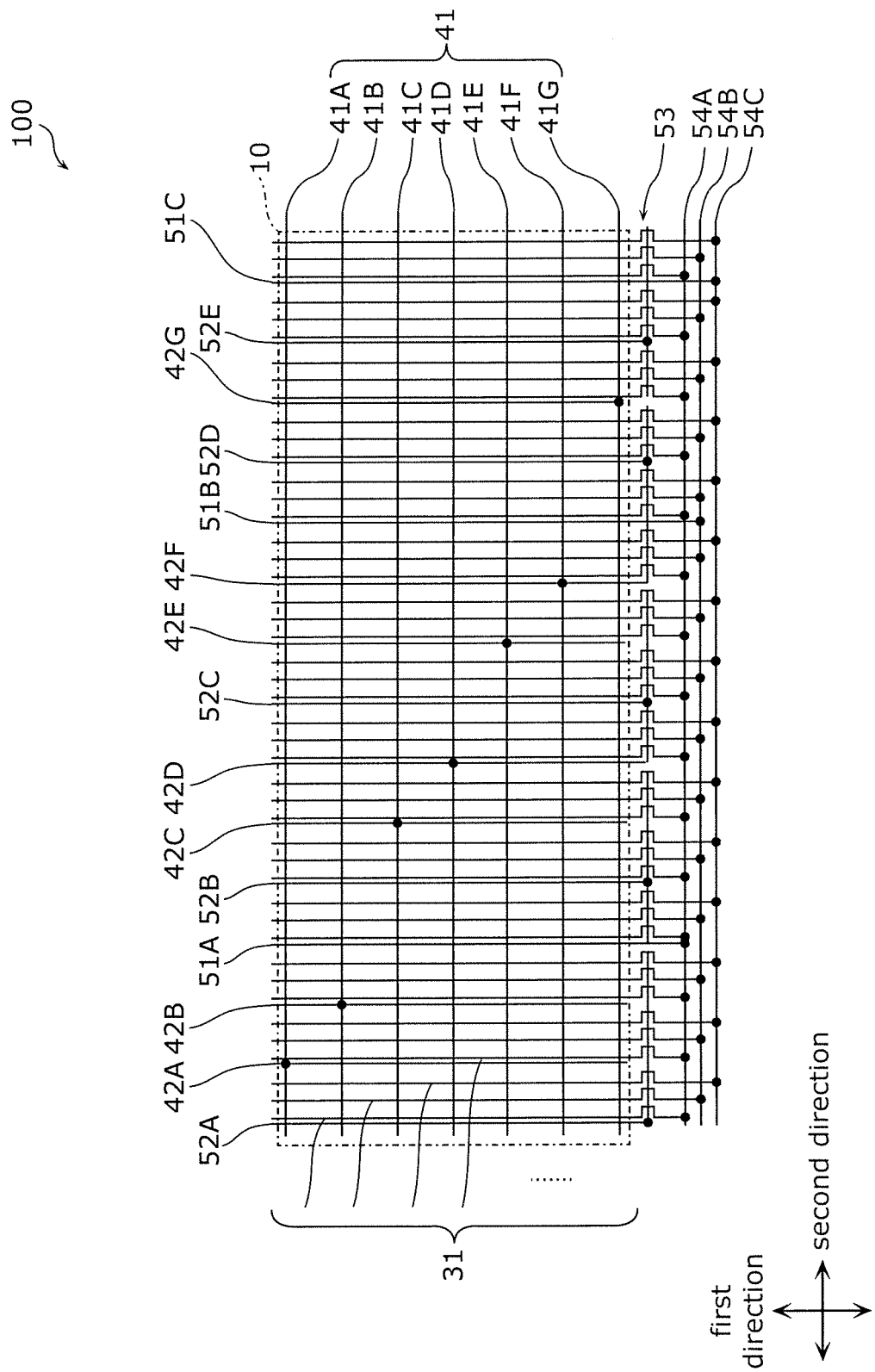
FIG. 7 is a schematic diagram illustrating a disposition relationship of various wirings in display device according to the exemplary embodiment.

For example, in a configuration of FIG. 7, at least one of the plurality of first inspection wirings 51 extends between two lead-out lines 42 adjacent to each other among the plurality of lead-out lines 42 in planar view. As a specific example, first inspection wiring 51A extends between lead-out lines 42B, 42C adjacent to each other, and first inspection wiring 51B extends between lead-out lines 42F, 42G adjacent to each other.

With this configuration, the plurality of first inspection wirings 51 are dispersed and disposed in the second direction, so that the routing of second inspection wiring 52 can be simplified in second edge side region 20B in FIG. 4. That is, by eliminating the region where first inspection wirings 51 are collectively disposed, second inspection wiring 52 can be disposed in the region where first inspection wirings 51 are collectively disposed. For this reason, each of the plurality of second inspection wirings 52 is disposed at a position closer to the area to which each of the plurality of second inspection wirings 52 corresponds, so that the routing of second inspection wirings 52 can be simplified in second edge side region 20B.

That is, in the configurations of FIGS. 2, 5, and 6, a part of second inspection wiring 52 is routed in second edge side region 20B (see FIG. 4). On the other hand, in the configuration of FIG. 7, the routing of second inspection wiring 52 can be simplified, and the area of frame region 20 can further be reduced.

In the above, the specific embodiments of the present application have been described, but the present application is not limited to the above-mentioned embodiments, and various modifications may be made as appropriate without departing from the spirit of the present application.

What is claimed is:

1. A display device comprising:
   a display region;
   a frame region disposed around the display region;
   a plurality of first wirings extending in a first direction in the display region;
   a first drive circuit electrically connected to one end of each of the plurality of first wirings;
   a plurality of second wirings extending in a second direction intersecting with the first direction in the display region;
   a second drive circuit electrically connected to the plurality of second wirings;
   a plurality of lead-out lines that extend in the first direction and electrically connect each of the plurality of second wirings and the second drive circuit in the display region;
   a plurality of first inspection wirings electrically connected to another end of each of the plurality of first wirings through each of a plurality of inspection thin film transistors;
   a plurality of second inspection wirings connected to a gate electrode of each of the plurality of inspection thin film transistors;
   an inspection drive circuit electrically connected to at least one of the plurality of second inspection wirings;
   an inspection circuit electrically connected to at least part of the first inspection wirings; and
   a plurality of pixel electrodes arrayed in the first direction and the second direction in the display region,
   wherein at least a part of the second inspection wirings extends in the first direction in the display region, and
   the plurality of pixel electrodes includes:
      a first pixel electrode and a second pixel electrode adjacent to each other in the second direction; and
      a third pixel electrode and a fourth pixel electrode adjacent to each other in the second direction,
         one of the plurality of lead-out lines extends between the first pixel electrode and the second pixel electrode in planar view, one of the plurality of second inspection wirings extends between the third pixel electrode and the fourth pixel electrode in planar view, none of the plurality of second inspection wirings is disposed between the first pixel electrode and the second pixel electrode, and none of the plurality of lead-out lines is disposed between the third pixel electrode and the fourth pixel electrode.

2. The display device according to claim 1, wherein the inspection drive circuit is included in the second drive circuit.

3. The display device according to claim 2, wherein the first drive circuit is disposed in a first edge side region constituting the frame region, and the second drive circuit is disposed in the first edge side region, or disposed in a second edge side region that constitutes the frame region and is opposed to the first edge side region.

4. The display device according to claim 1, wherein at least one of the plurality of second inspection wirings extends between two adjacent lead-out lines of the plurality of lead-out lines in planar view.

5. The display device according to claim 1, wherein the plurality of pixel electrodes further includes a fifth pixel electrode and a sixth pixel electrode adjacent to each other in the second direction, at least a part of the plurality of first inspection wirings extends in the first direction in the display region, one of the plurality of first inspection wirings extends between the fifth pixel electrode and the sixth pixel electrode in planar view, none of the plurality of first inspection wirings is disposed between the first pixel electrode and the second pixel electrode, and between the third pixel electrode and the fourth pixel electrode, and none of the plurality of second inspection wirings and the plurality of lead-out lines is disposed between the fifth pixel electrode and the sixth pixel electrode.

6. The display device according to claim 5, wherein at least one of the plurality of first inspection wirings extends between two adjacent lead-out lines of the plurality of lead-out lines in planar view.

7. The display device according to claim 1, wherein at least a part of the first inspection wiring extends in the first direction in the display region.

8. The display device according to claim 1, wherein at least part of the plurality of second inspection wirings is connected to gate electrodes of at least two inspection thin film transistors included in the plurality of inspection thin film transistors.

9. The display device according to claim 1, wherein at least part of the plurality of first inspection wirings is electrically connected to at least two inspection thin film transistors included in the plurality of inspection thin film transistors.

10. The display device according to claim 1, wherein the inspection drive circuit is disposed in a first edge side region constituting the frame region, the plurality of inspection thin film transistors are disposed in a second edge side region that constitutes the frame region and is opposed to the first edge side region, and at least a part of the plurality of second inspection wirings is disposed in the second edge side region.

11. The display device according to claim 1, wherein the inspection drive circuit is disposed in a first edge side region constituting the frame region, and the inspection circuit is disposed in the first edge side region.

* * * * *